United States Patent [19]
Frater

[11] Patent Number: 6,129,990
[45] Date of Patent: Oct. 10, 2000

[54] COPPER/STEEL LAMINATED SHEET FOR USE IN MANUFACTURING PRINTED CIRCUIT BOARDS

[75] Inventor: Mark S. Frater, Stockton, Calif.

[73] Assignee: R. E. Service Company, Inc., Lodi, Calif.

[21] Appl. No.: 09/193,461

[22] Filed: Nov. 17, 1998

Related U.S. Application Data

[63] Continuation-in-part of application No. 09/058,262, Apr. 10, 1998, and a continuation-in-part of application No. 09/182,956, Oct. 29, 1998.

[51] Int. Cl.$^7$ .................................................. B32B 15/01
[52] U.S. Cl. .......................... 428/607; 29/830; 156/233; 156/288; 174/255; 174/256; 428/606; 428/612; 428/677; 428/687
[58] Field of Search ................................... 428/607, 606, 428/612, 687, 677; 174/255, 256; 156/233, 288; 29/830

[56] References Cited

U.S. PATENT DOCUMENTS

| | | |
|---|---|---|
| Re. 29,820 | 10/1978 | Konicek . |
| 2,688,348 | 9/1954 | Sullivan . |
| 2,706,165 | 4/1955 | Korgaard . |
| 3,589,975 | 6/1971 | Andrews et al. . |
| 3,592,722 | 7/1971 | Morgan . |
| 3,647,592 | 3/1972 | Woodberry . |
| 3,730,825 | 5/1973 | Nakane . |
| 3,808,088 | 4/1974 | Knechtges et al. . |
| 3,932,250 | 1/1976 | Sato et al. . |
| 3,936,548 | 2/1976 | Konicek . |
| 3,948,701 | 4/1976 | Fasbender et al. . |
| 3,984,598 | 10/1976 | Sarazin et al. . |
| 3,990,926 | 11/1976 | Konicek . |
| 4,022,648 | 5/1977 | Woodberry et al. . |
| 4,023,998 | 5/1977 | Cederberg et al. . |
| 4,092,925 | 6/1978 | Fromson . |
| 4,113,576 | 9/1978 | Hutkin . |
| 4,179,324 | 12/1979 | Kirkpatrick . |
| 4,180,608 | 12/1979 | Del . |
| 4,351,873 | 9/1982 | Davis . |
| 4,357,395 | 11/1982 | Lifshin et al. . |
| 4,381,327 | 4/1983 | Briere . |
| 4,383,003 | 5/1983 | Lifshin et al. . |
| 4,394,419 | 7/1983 | Konicek . |
| 4,446,188 | 5/1984 | Patel et al. . |

(List continued on next page.)

FOREIGN PATENT DOCUMENTS

| | | |
|---|---|---|
| 0 212 124 | 3/1987 | European Pat. Off. . |
| 0 235 582 | 9/1987 | European Pat. Off. . |
| 299 454 | 1/1989 | European Pat. Off. . |
| 0 411 142 | 2/1991 | European Pat. Off. . |
| 0 872 301 | 10/1998 | European Pat. Off. . |
| 0 872 301 A1 | 10/1998 | European Pat. Off. . |
| 28 43 263 | 2/1980 | Germany . |
| 31 31 688 | 5/1982 | Germany . |
| 41 16 543 | 11/1992 | Germany . |
| 297 19 716 U | 12/1997 | Germany . |
| 52-5353 | 2/1977 | Japan . |
| 62-208915 | 9/1987 | Japan . |
| 2-58885 | 2/1990 | Japan . |
| 2-291191 | 11/1990 | Japan . |
| 2-310041 | 12/1990 | Japan . |
| 4-186798 | 7/1992 | Japan . |
| 1 217 104 | 12/1970 | United Kingdom . |

OTHER PUBLICATIONS

Pohl et al., "Producing and Jointly Processing Base Laminates for Multilayer Printed Circuit Cards", IBM Technical Disclosure Bulletin, vol. 27, No. 8, Jan. 1985, pp. 4841–4842.

(List continued on next page.)

*Primary Examiner*—Deborah Jones
*Assistant Examiner*—Robert R. Koehler
*Attorney, Agent, or Firm*—John P. O'Banion

[57] ABSTRACT

A sheet laminate for use in a press lay-up between printed circuit board panels having a steel substrate layer and a copper foil layer releasibly bonded to at least one surface of the substrate layer.

10 Claims, 3 Drawing Sheets

U.S. PATENT DOCUMENTS

| | | |
|---|---|---|
| 4,455,181 | 6/1984 | Lifshin et al. . |
| 4,568,413 | 2/1986 | Toth et al. . |
| 4,587,152 | 5/1986 | Gleichenhagen et al. . |
| 4,715,116 | 12/1987 | Thorpe et al. . |
| 4,722,765 | 2/1988 | Ambros et al. . |
| 4,775,599 | 10/1988 | Matsuoka et al. ............ 428/687 |
| 4,781,969 | 11/1988 | Kobayashi et al. . |
| 4,788,102 | 11/1988 | Koning et al. . |
| 4,847,146 | 7/1989 | Yeh et al. . |
| 4,872,934 | 10/1989 | Kameda . |
| 4,875,283 | 10/1989 | Johnston . |
| 4,961,806 | 10/1990 | Gerrie et al. . |
| 5,030,302 | 7/1991 | Jud et al. . |
| 5,057,372 | 10/1991 | Imfeld et al. . |
| 5,096,522 | 3/1992 | Kawachi et al. . |
| 5,120,590 | 6/1992 | Savage et al. . |
| 5,153,050 | 10/1992 | Johnston . |
| 5,350,621 | 9/1994 | Yuhas et al. . |
| 5,407,744 | 4/1995 | Herrero et al. ............ 428/606 |
| 5,512,381 | 4/1996 | Konicek et al. . |
| 5,674,596 | 10/1997 | Johnston . |
| 5,716,168 | 2/1998 | Janoff . |
| 5,725,937 | 3/1998 | Johnston . |
| 5,789,066 | 8/1998 | De Mare et al. ............ 428/612 |

OTHER PUBLICATIONS

Declaration of Robert Jordan, United States District Court, Northern District of California, San Jose Division, Case No. C92 20672 JW (PVT), Nov. 25, 1992.

Declaration of Glynn Shaw, United States District Court, Northern District of California, San Jose Division, Case No. C92 20672 JW (PVT), Nov. 30, 1992.

Declaration of Alan Gishi, United States District Court, Northern District of California, San Jose Division, Case No. C92 20672 JW (PVT), Dec. 7, 1992.

Memorandum to the Assistant Comissioner of Patents, Response to Petition for Public Use Proceeding Under 37 CFR 1.292, Ser. No. 07/955,121, United States Patent and Trademark Office, Dec. 8, 1994, pp. 3–4.

Examiner's Action, Ser. No. 07/955,121 United States Patent and Trademark Office, Jul. 11, 1996, pp. 7–8.

Hinton, P., "The High–Yield Challenge in Laminating MLBs", Elelctronic Packaging and Production, vol. 30, No. 1, pp. 56–61, Jan. 1990.

COPPER/STEEL LAMINATED SHEET FOR USE IN MANUFACTURING PRINTED CIRCUIT BOARDS

CROSS-REFERENCE TO RELATED APPLICATIONS

This application is a continuation-in-part of copending application Ser. No. 09/058,262 filed on Apr. 10, 1998, now allowed, and a continuation-in-part of copending application Ser. No. 09/182,956 filed on Oct. 29, 1998, now allowed.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

This invention pertains generally to circuit board fabrication, and more particularly to a copper/metal laminated structure for use in the manufacture of printed circuit boards.

2. Description of the Background Art

In early stages of manufacturing technology, printed circuit board (PCB) lay-up panels were laminated using presses similar to those used in the wood industry for laminating, for example, sheets of plywood. Hydraulic-driven presses were used, and steam or electric power was used to heat the presses to temperatures exceeding 350° F. The panel components in the presses were submitted to pressures between 300 psi and 500 psi at 350° F. for approximately one hour to achieve lamination. Highly polished and precision ground stainless steel plates approximately 0.062 inches thick were used to separate each panel within a press opening. Typically, a T-304 full hard alloy or equivalent material was used for these 0.062 stainless steel separator plates. A problem, however, was that these stainless steel 0.062 separator plates required cleaning or scrubbing to remove debris after every use and periodically needed to be resurfaced to remove dents and scratches due to handling and use. Eventually, the plates had to be replaced.

During the late 1980's, the introduction of vacuum assisted presses permitted the use of lower pressures during the lamination cycle. The pressures used in vacuum assisted presses typically ranged from approximately 150 psi to 250 psi, as opposed to the 300 psi to 500 psi range used in the hydraulic steam driven or electric presses. With vacuum assisted presses, aluminum separator sheets ranging in thickness from 0.007 to 0.015 inches were tested and then used extensively. Test results published during that time indicated that thin aluminum separator plates far exceeded the performance of steel plates for laminating PCB panels. These thin aluminum separator sheets were discarded after the lamination process, thus eliminating the need for expensive steel plate cleaning and handling operations and the frequent and high capital investment needed to replace the steel plates. The alloy used for aluminum separator plates is typically 3000 series (e.g. 3003, 3004, 3105 or equivalent) with a H19 hardness designation, which is identical to the alloy used to make aluminum beverage cans. The process using thin aluminum separator sheets along with low pressure from vacuum assisted presses has worked well for typical 4 layer to 6 layer PCB's with circuit lines of approximately 0.008 inches in width and approximately 0.008 inches apart. A typical configuration in a press opening would be a steel plate on top and bottom of the stack with thin aluminum sheets separating each PCB panel. The rate of production in these vacuum assisted presses increased to about 10–14 PCB panels per typical 1½ inch press opening from the 6 to 8 PCB panels achieved using 0.062 stainless steel sheets.

Technological advancements, however, have driven a need for PCBs having more and denser circuitry. This means that circuits must have finer lines (less than 0.006 inches wide) and closer spacing between circuit lines (less than 0.006 inches). Denser surfaces on a PCB permit a higher quantity of electrical components to be mounted thereon, thus enabling faster information processing and greater miniaturization of electronic hardware. These greater technological demands have made the surface quality of the laminated circuit board panels even more critical. Problems such as surface roughness and image transfer that also previously existed, have now become critical issues that require resolution, as any minute bump on the surface of the aluminum sheet will be transferred to the top surface of the board necessitating scraping the board and reworking the PCB fabrication process.

To prevent and minimize scrap and rework due to image transfer and surface quality problems, almost every press configuration used today employs 0.062 stainless steel plates (usually T-304 or T-600 stainless steel) placed adjacent to the thin aluminum separator sheets in addition to on the top and bottom of the stack. Many press loads have at least three steel plates added to the lay-up, which then reduces the number of panels that can be laminated in each press cycle. Some of the lay-up configurations have both aluminum sheets and steel plates separating every panel in the press, with the aluminum separator sheets being discarded after the press cycle. This approach, however, has not completely cured the problem as it causes a decrease in the production rate of the press. Also, pits, dents and other surface imperfections due to the re-introduction of steel plates into the process are still causing scrap and rework of PCB panels. Moreover, many PCB fabricators have to purchase additional new 0.062 stainless steel plates and again install expensive plate cleaning and handling systems. Although the thin aluminum separator sheets are discarded after every press cycle, the steel plates must be cleaned before each use, adding additional operational steps and cost to the PCB fabrication process. To maintain production demands, fabricators must purchase additional vacuum presses, at a cost of approximately $250,000 to $1,000,000 per unit, to compensate for the loss of productivity due to the re-introduction of steel plates into the PCB fabrication process.

Today, fabricators are producing between 3 and 8 PCB panels on high technology dense boards with more quality problems and at a high cost. Dense state of the art PCB's now require 2 separators, an 0.062 stainless steel plate and a thin sheet of aluminum. This is an expensive step backward to the beginning of the evolution of the PCB fabrication process.

Use of a thin piece of aluminum in a copper/aluminum laminate structure simply does not meet today's demanding requirements for high technology, dense PCB's. Such laminates suffer from a number of drawbacks which include susceptibility to print through and image transfer, misregistration, blistering, warpage and delamination. In addition, they exhibit unacceptable surface roughness.

Off contact printing often results from image transfer. This generally inhibits the adhesion of dry film and the ability to expose a one to one image on panels. As a result, such laminates are typically limited to fabricating four to six layer PCB's. In addition, shims are often required between every PCB panel. The use of shims adds significant cost to PCB manufacture. The shims must go through a labor intensive cleaning process between each use. Shims are very expensive and many PCB manufacturers have had to set aside space in their manufacturing facilities for shim cleaning.

Misregistration results from too much movement in the inner layers. This causes drill breakage and renders the PCB useless. Drill breakage also results from misregistration in high technology PCBs where small holes which are less 13 mils and as small as 4 mils are typical.

Bestirring results from the uneven coefficient of thermal expansion exhibited by aluminum. The uneven CTE creates more hot spots which cause blistering. This problem may not even show up for six months or more after fabrication and, therefore, may cause major system failures.

Surface roughness is also a problem with aluminum. The high surface roughness will cause off contact printing, broken drill bits, and loss of materials. The laminates are also susceptible to warpage which renders them useless. And, delamination has been observed using the laminates at low pressures.

BRIEF SUMMARY OF THE INVENTION

The deficiencies inherent in conventional PCB laminates and lamination processes are overcome by the laminate structure of the present invention which generally comprises a sheet of corrosion resistant metal, other than aluminum or copper, that is attached to a sheet of copper. By way of example, and not of limitation, the invention preferably comprises a steel layer having a corrosive resistant coating, and a copper foil layer attached to the steel allow layer. Attachment can be facilitated in any conventional manner using, for example, adhesive materials in the manner described in used in U.S. Pat. No. 5,153,050 incorporated herein by reference, U.S. Pat. No. 5,120,590 incorporated herein by reference, or U.S. Pat. No. 5,512,381 incorporated herein by reference. Therefore, it does not matter whether the adhesive is applied in a band as described in U.S. Pat. No. 5,153,050 to provide a continuous seal, or applied in intermittent spots or islands as described in U.S. Pat. No. 5,120,590 where neither a continuous nor substantially continuous seal is provided. Nor does it matter whether the adhesive is flexible or rigid. It will be appreciated, however, that the adhesive should be of a type that either releases the sheets at press temperatures or otherwise does not interfere with the subsequent separation of the sheets. Preferably, however, the sheets are directly bonded to each other using resistance welding or the like, so that bonding takes place without the use of an adhesive.

In the present invention, the copper foil layer is attached to either one or both sides of the steel layer. When heated and compressed onto the PCB panel, the copper adheres to and becomes a functional element of the final PCB. The steel layer is subsequently removed and discarded. Use of the steel layer of the present invention eliminates and/or reduces the need for conventional 0.062 stainless steel plates in the press lay-up. As a result, the surface quality of the PCB is improved, image transfer is reduced and a flatter, less wavy PCB is produced without the cost of using separate 0.062 stainless steel separator plates. Furthermore, the similarity in the coefficients of thermal expansion (CTE) between steel in accordance with the present invention and copper allows the PCB's produced to be flatter, thus providing for a better registration of the foil layer to the substrate layer of the sheet laminate.

Additional information regarding sheet laminate fabrication technology and processes for manufacturing PCB's can be found in U.S. Pat. Nos. 4,875,283, 5,120,590, 5,512,381 and 5,153,050, each of which is incorporated herein by reference.

The copper/steel laminate structure of the present invention exhibits superior performance over copper/aluminum, copper/copper, and other known copper/metal laminate structures. For example, with the laminate structure of the present invention it is possible to manufacture PCBs having up to eighteen layers without the need to use shims. Because the steel sheet used in the present invention does not exhibit the image transfer problems associated with aluminum/copper and copper/copper laminates, the invention also allows more PCBs per book as compared to conventional laminates thereby facilitating increased production. In addition, the steel layer allows PCBs to be run at higher pressures, thereby providing a flatter and more usable PCB area. Furthermore, the need for conventional 0.062 stainless steel separator plates is eliminated, with a resulting reducing in material and facility cost. Also, the steel layer used in the present invention exhibits a more stable heat rise than aluminum, thereby reducing the possibility of misregistration and drill breakage. Blistering and warpage are also reduced because the CTE of the metal substrate of the present invention is similar to that of copper. And, the smooth surface of the steel of the present invention promotes the fabrication of high density PCBs. Also, delamination problems associated with aluminum/copper and copper/copper laminate structures are eliminated.

An object of the invention is to provide a sheet laminate, for use in a press lay-up between PCB layers, that eliminates the need for aluminum separator sheets and their associated problems.

Another object of the invention is to eliminate the need for using adhesives between the functional layer and the separator layer of PCB laminate structures.

Another object of the invention is to reduce the amount of waste in PCB manufacturing.

Another object of the invention is to eliminate the surface quality and image transfer problems associated with aluminum separator sheets.

Another object of the invention is to eliminate the need for constant scrubbing and cleaning of conventional 0.062 stainless steel separator plates.

Another object of the invention is to provide a sheet laminate, for use in a press lay-up between PCB layers, that eliminates the need for using an adhesive between the functional element and the separator sheet.

Another object of the invention is to provide a sheet laminate, for use in a press lay-up between PCB layers, that eliminates the need for conventional 0.062 stainless steel plates and their associated problems.

Another object of the invention is to provide a sheet laminate, for use in a press lay-up between PCB layers, that reduces and/or eliminates image transfer from the substrate layer onto the foil layer.

Another object of the invention is to provide a sheet laminate, for use in a press lay-up between PCB layers, that results in flatter, less wavy PCB panels.

Another object of the invention is to provide a sheet laminate for use in a press lay-up between PCB layers that has a CTE less than or equal to the CTE of copper.

Still another object of the invention is to provide a sheet laminate, for use in a press lay-up between PCB layers, that maximizes the number of PCB panels that can be produced for a given press opening.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWING

The invention will be more fully understood by reference to the following drawings which are for illustrative purposes only.

DETAILED DESCRIPTION OF THE INVENTION

Referring to FIG. 1 through FIG. 4, where like reference numbers denote like parts, as well as the following technical description, the present invention comprises a laminate sheet structure comprising a thin sheet of steel material bonded to a thin sheet of copper. It will be appreciated that the apparatus may vary as to configuration and as to details of the parts without departing from the basic concepts as disclosed herein.

Figure 1:
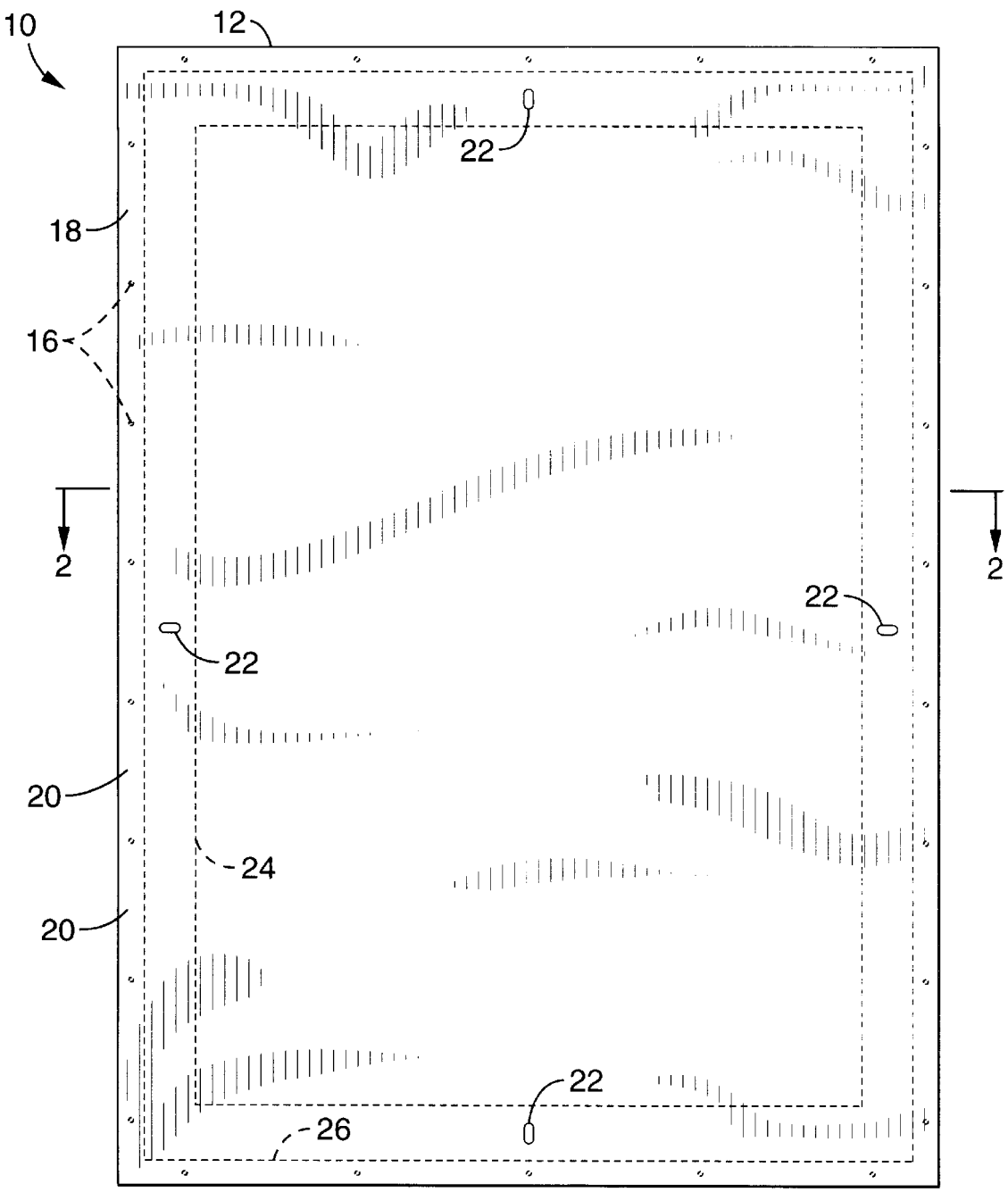
FIG. 1 is a schematic plan view of a directed bonded laminate sheet in accordance with the present invention.
Figure 2:
FIG. 2 is a cross-section of the laminate sheet shown in FIG. 1 taken through line 2—2.

In FIG. 1 and FIG. 2, a sheet laminate 10 for PCB manufacturing in accordance with the preferred embodiment of the present invention is generally shown. Sheet laminate 10 comprises a metal substrate layer 12 bonded to a copper foil layer 14. In accordance with the invention, metal substrate layer 12 preferably comprises a steel alloy having the properties described herein. And, while the invention is described herein in terms of a copper/metal laminate, it will be appreciated that the inventive concepts apply equally to laminates having additional layers, such as copper/metal substrate/copper laminates typically used in the PCB manufacturing industry.

Copper foil layer 14 can be present on either or both sides of steel layer 12. Use of a steel layer in accordance with the present invention has been found to be superior to the commonly used 0.010 inch to 0.015 inch 3004 aluminum substrate for reducing image transfer and improving surface quality of the PCB, while also significantly improving productivity of PCB panels. Sheet laminate 10 of the present invention is designed for use in both traditional low pressure vacuum presses that operate in the range between approximately 150 psi and 250 psi, as well as high pressure presses up to 500 psi, which is well beyond the capability of aluminum.

Nickel or zinc-nickel plated 1008 low carbon steel has been determined to be ideal for meeting the objectives of the invention, although 1001 low carbon steel should also be suitable. The thickness of steel layer 12 can range from approximately 0.002 inches and 0.025 inches, although the preferable thickness range is between approximately 0.005 inches and 0.015 inches. Copper foil layer 14 preferably has a thickness ranging from approximately 0.00025 inches to approximately 0.005 inches.

Greater productivity is accomplished, while still meeting the other objectives of the invention, through use of a steel layer 12 that is approximately 0.008 inches thick and this thickness represents the preferred embodiment of the invention. The use of a steel layer approximately 0.008 inches thick eliminates the need or reduces the number of steel plates required in a press lay-up, resulting in a greater number of PCB panels capable of being placed into the press for a given lamination process. The "kiss cycle" during the lamination process, which is a prerequisite for the successful use of aluminum substrates, can also eliminated as a result of the use of a steel layer in accordance with the invention, thereby reducing the overall production time. The function of the "kiss cycle" is to soften or melt the epoxy before full pressure is applied. Fully liquefied epoxy flows away from the high pressure area into regions between circuits to minimize print through.

For illustrative purposes, the metallurgical and other characteristics of the preferred steel alloy used in the present invention are compared with aluminum in Table 1.

It will be appreciated that the surface of the PCB laminate that is produced is only as smooth as the material that is pressed against it. The surface quality of the PCB laminated with metal substrates is improved significantly by employing a steel layer having a surface finish of no greater than approximately 12 RMS. In comparison, aluminum has a surface finish around 18 RMS to 25 RMS. The issue of surface finish is critical especially when miniaturization is an objective, because the fewer imperfections that exist on the surface of the PCB when dense electrical paths are etched thereon, the more reliable the final PCB product. The steel substrate 12 employed in the present invention has a low propensity to scratch, pit or dent because it is many times harder than other metals, such as aluminum. Therefore, a PCB laminated with a steel substrate according to the invention will have less likelihood of surface imperfections.

Another the advantage provided by the steel substrate used in sheet laminate 10 is the additional hardness steel offers, along with greater rigidity, which significantly reduces image transfer onto foil layer 14 and ultimately, onto the finished PCB. For purposes of the present invention, a Knoop hardness of approximately 200 for the steel of the invention provides satisfactory results at the desired. A PCB laminated with such a steel substrate is also less wavy as compared to a PCB laminated with an aluminum substrate. It will be appreciated that harder steel substrate is also satisfactory and contemplated within the scope of the present invention. For example, at the specified thicknesses, it is possible to obtain steel substrates from suppliers with Knoop hardness ratings as high as approximately 850. Typically, though, the harder steels this thin are not easily available in the industry. It will further be appreciated that softer steel substrate is acceptable provided that it is not too soft. For example, a steel allow substrate having a Knoop hardness of approximately 150 should also provide satisfactory results. It will also be appreciated, that the steel substrate of the present invention should be harder than either aluminum or copper to achieve the desired results described herein.

Preferably the steel substrate is plated with nickel or nickel-zinc to provide corrosion resistance, although other common resistant coats, including polymers or electrolized aluminum (chrome), could be used. Lead, however, would not be an appropriate material since it is very soft and will bond to the copper foil layer during when heated. An additional surprising characteristic results from nickel plating steel substrate 12; namely, the hardness increases as it gets hotter. For example, the hardness of the nickel plated steel increases by approximately 20% as the substrate is heated to the curing temperature of 350° F. The optimum thickness of the nickel plating is typically between approximately 20 μinches and approximately 50 μinches.

The greater rigidity provided by the steel layer 12 used in the present invention also provides better support for copper foil layer 14 and practically eliminates the bellows-effect associated with aluminum substrates. Because of low rigidity, an aluminum substrate flexes easily and, when flexed, the aluminum substrate momentarily separates from the copper foil layer thereby creating a suction that draws dust and debris into the resultant gaps; that is, a bellows effect occurs. As a result of dust and debris entering the gaps, dent and epoxy spots appear on the finished PCB surface. A complete seal between the steel layer 12 and foil layer 14, which is essential for aluminum substrates, is therefore unnecessary for steel substrates.

Significantly, the atomic crystal lattice patterns for aluminum and nickel plated steel are very different. The atoms in aluminum are arranged in a face centered cubic (FCC) pattern. The atoms in steel, however, are arranged in a body centered cubic (BCC) pattern. The nickel plating on the steel substrate is amorphous with no definite microstructure. This material is not a wrought product and is created by an electrical plating process. These crystal lattice patterns significantly influence the physical and mechanical properties of each material and explain why they present different characteristics in the same heated environment.

The heat transfer characteristics of steel provide a consistent and uniform heat rise with little variability. It is this uniformity in heat rise that reduces PCB panel thickness variations and provides a more consistent lamination quality with the present invention. The steel should have a CTE less than that of copper (e.g. less than approximately 9.8 μinches/° F.) so as to allow the copper foil layer to proportionally register with the steel substrate layer. During the thermal expansion process, copper foil layer 14 moves more than substrate 12, so a substrate material having a CTE equal to or less than copper would optimize registration between the two substances. Substrate 12 preferably has a coefficient of thermal expansion ranging between approximately 6.5 μinches/° F. and approximately 7.5 μinches/° F. Copper expands to approximately 50% as compared to expansion of aluminum while steel expands to approximately 90% as compared to aluminum. In direct comparison, the CTE of aluminum is 84% greater than that of steel. This means that a 24-inch wide unrestrained sheet of aluminum heated from room temperature (70° F.) to curing temperature will have its width increased by approximately 0.090 inches. A steel sheet of identical proportion will have a width increase of approximately 0.049 inches and copper will have a width increase of approximately 0.066 inches. It can be clearly seen that not only are the dimensional differences between copper and steel less than the dimensional difference between aluminum and copper, the steel expands overall less than the copper which has been determined to be preferable. As a result, the PCB's produced using steel substrates are flatter and more uniform as compared with those produced using aluminum substrates.

The primary material for PCB panels is woven fiberglass which is pre-pregnated (pre-preg) with a viscous thermosetting resin. Copper from the foil layer in the sheet laminate is transferred onto each face of the pre-preg in the press during lamination. During lamination, the woven fiberglass and resin pre-preg are heated and become a viscous liquid, free to expand along with the metals in the stack. Therefore, no significant stresses are induced into these composite materials by thermal expansion during heat up for curing. Since copper foil layer 14 is very thin compared to steel layer 12, frictional forces will restrain copper foil layer's 14 movement during heating. The copper will therefore yield as the substrate material expands. If the substrate material is aluminum, the copper foil layer will be stretched 0.024 inches over the width of a twenty-four inch circuit board heated to the curing temperature, and uneven localized loading will cause the foil layer to be stretched non-uniformly, more in some areas than others, resulting in a "rippling" or "wavy" effect in the copper foil layer. On the other hand, if the substrate material is steel according to the invention herein, copper foil layer 14 will not be stretched during heating to the curing temperature, and thus no uneven loading will occur on copper foil layer 14 and also blister causing strains in copper foil layer 14 is reduced.

Instead of using an adhesive as is used in conventional laminate structures in the PCB manufacturing industry, steel layer 12 of the present invention is preferably attached to copper layer 14 through the use of a plurality of spaced-apart welds 16. Welds 16 are contact bonds between the surfaces of the materials and generally comprise circular-shaped welds of approximately 4-mils to 20-mils in diameter. In this manner, the surfaces of the two materials are directly bonded without the use of adhesives or other intermediate bonding agents such as solder. While resistance welding is a technique known in other industries, its application to the PCB manufacturing industry is unique.

Resistance welding is a thermoelectric process in which heat is generated by passing an electrical current through the parts to be joined. The process uses electrodes to push the parts together with sufficient force to remove the surface oxides that would otherwise inhibit current flow. Once physical contact is established, a controlled combination of resistance generated heat and physical pressure is applied through the electrodes to create the actual joint. The amount of heat generated is a function of the current applied, the length of time it is applied, and the resistance profile between the parts being joined.

Resistance welding is generally understood as a method for bonding materials in one of three ways. One way is through brazed or soldered bonds, where resistance heating of the parts to be joined generates sufficient heat to melt a third metal, such as silver solder alloy or tin/lead solder that is used as an intermediate bonding agent. A second way is use forge welds where a very short weld-time current is used to forge the parts together without melting them; that is, to establish a metal to metal bond. Forge welds are particularly well suited for joining dissimilar materials. The third way is through fusion bonding where a longer pulse is used to melt both parts to a liquid at their interface point, and the parts are held together as they cool to establish metal to metal bonds. Fusion bonding is particularly well suited for joining two similar materials.

In the preferred embodiment of the invention, the materials are joined using forge welds rather than using fusion bonding or an intermediate bonding agent such as solder between the materials. It is important that welds 16 be sufficiently weak that, when the laminate structure is placed into the press and the copper is heated and compressed onto the PCB panel, the strong bond between the copper and pre-preg in the PCB panel automatically breaks the welds so that the metal substrate 12 can easily be removed and discarded. For a copper/steel/copper laminate structure using the materials described herein, satisfactory bonds can be achieved using approximately 10.6 watt-seconds of energy and a welding head force of approximately five pounds. These levels are affected by the following variables: the welding energy used to generate heat, the amount of time the energy is applied, the physical weld force that is applied, and the properties of the materials being joined such as metallurgic properties, resistance, thickness, configuration and coatings. Preferably from approximately 5.0 watt-seconds to approximately 25 watt-seconds of energy and approximately two pounds to ten pounds of force should be available to accommodate production variances. Exact values can be determined empirically.

A system suitable for carrying out resistance welding in accordance with the present invention is available from UNITEK, and includes a model 125DP dual pulse power supply with a maximum output of 125 watt-seconds, a model PM7S programmable AC power supply rated at 2 KVA, a model 80A/24 air actuated weld held, rated 125 ws/2 kva and 8 ounce to 20 pounds of force, model ESO413 tungsten electrodes, and models EW4002 and HW1090 wheel electrodes. It will also be appreciated that other types of welding techniques could be used, and that the bonds need only be sufficiently strong to remain intact during material handling but be capable of being broken in the press.

Welds 16 are placed around the perimeter of the sheets and within a marginal area 18. While the width of marginal area 18 can be larger if specified by the customer, the present invention permits the use of a smaller marginal area than that commonly found in the industry. More particularly, because of the precision with which the resistance welds can be made, it is possible with the present invention to reduce the width of marginal area 18 to approximately 0.25 inches or less from the outside edge of the sheets if desired. For example, conventional laminate structures typically have marginal areas of between approximately 0.50 inches and 1.0 inches wide, which provides a total overlap of approximately 1.0 inches to 2.0 inches. This is due to the flow characteristics of the adhesive leaving a unusable area around the perimeter of the laminate structure. In practice, the unusable marginal area is trimmed away in the manufacturing process, leaving a finished board size. For example, in order to achieve a standard sized 18-inch×24-inch circuit board panel where adhesives are used, a 19-inch×25-inch laminate is generally required because there is a 0.50 inch border along each side which is cut away after lamination. Hence, the resistance welding technique of the present invention is advantageous in that it eliminates waste, thus providing a larger effective usable area of the PCB panel.

Welds 16 are arranged generally linearly in a plurality of occurrences such that gaps or openings 20 are defined between welds 16. The length of gaps 20 can vary, but would typically range from approximately ½ inch to 2.5 inches depending upon the product type and specification. Apertures 22 along each edge of laminate 10 represent typical tooling positions. Apertures 22 are typically disposed between the outer edges of apparatus 10 and the finished circuit area 24. The finished panel edge 26 is formed after flash trimming by the customer.

Note also that, because use of a steel layer in accordance with the present invention eliminates the bellows effect found in copper/aluminum laminate structures, there is no need for a continuous seal between the layers to guard against entry of dust and debris. Therefore, in the present invention not only is the need for an adhesive eliminated, but the bonding points do not have to form a band around the perimeter of the sheets. And, while welds 16 are shown positioned along all four sides of the structure, they could be alternatively positioned along one side, two opposing sides, two adjacent sides, or along three sides.

Figure 3:
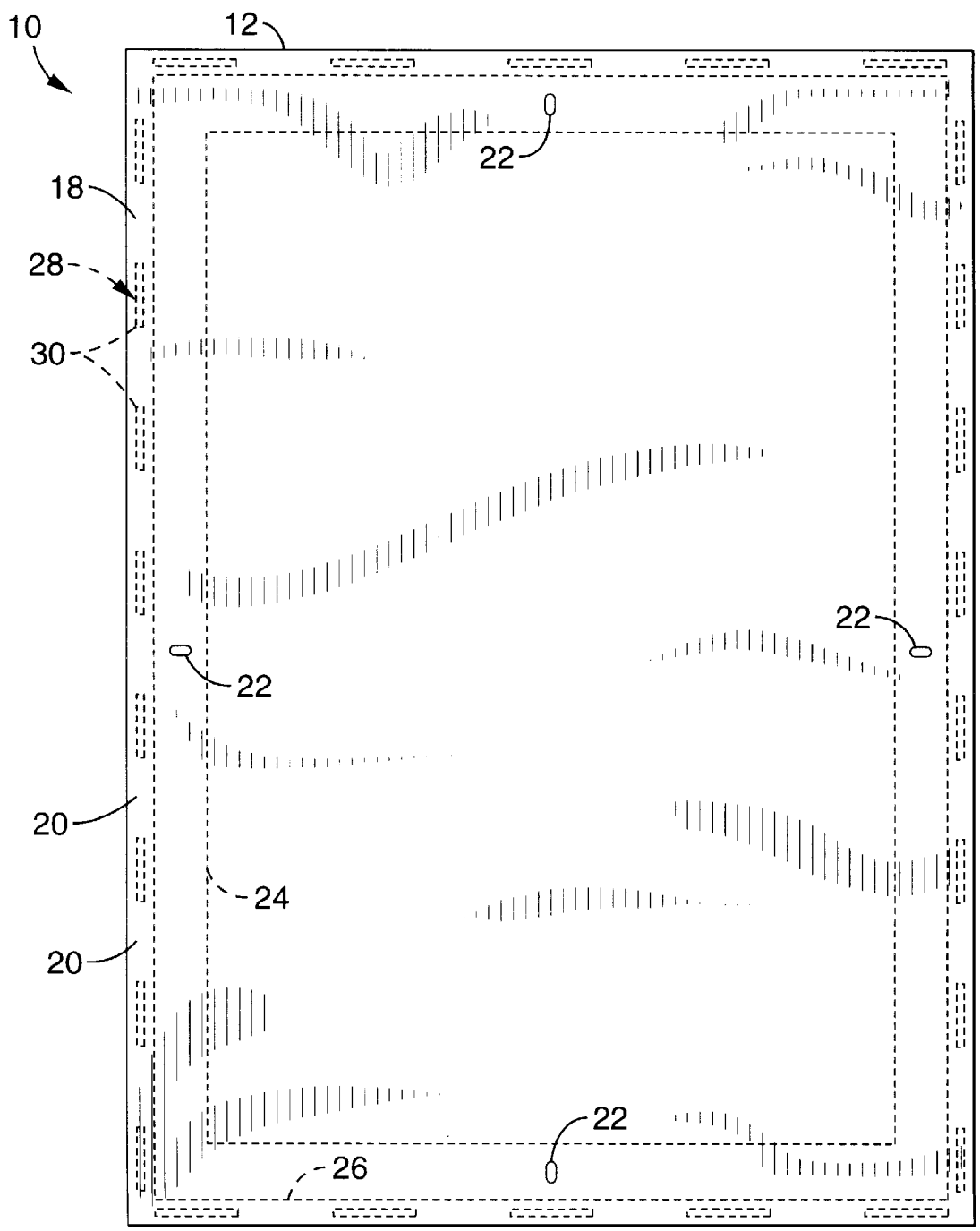
FIG. 3 is a schematic plan view of an adhesive bonded embodiment of a laminate sheet in accordance with the present invention where the adhesive is applied in discontinuous occurrences.
Figure 4:
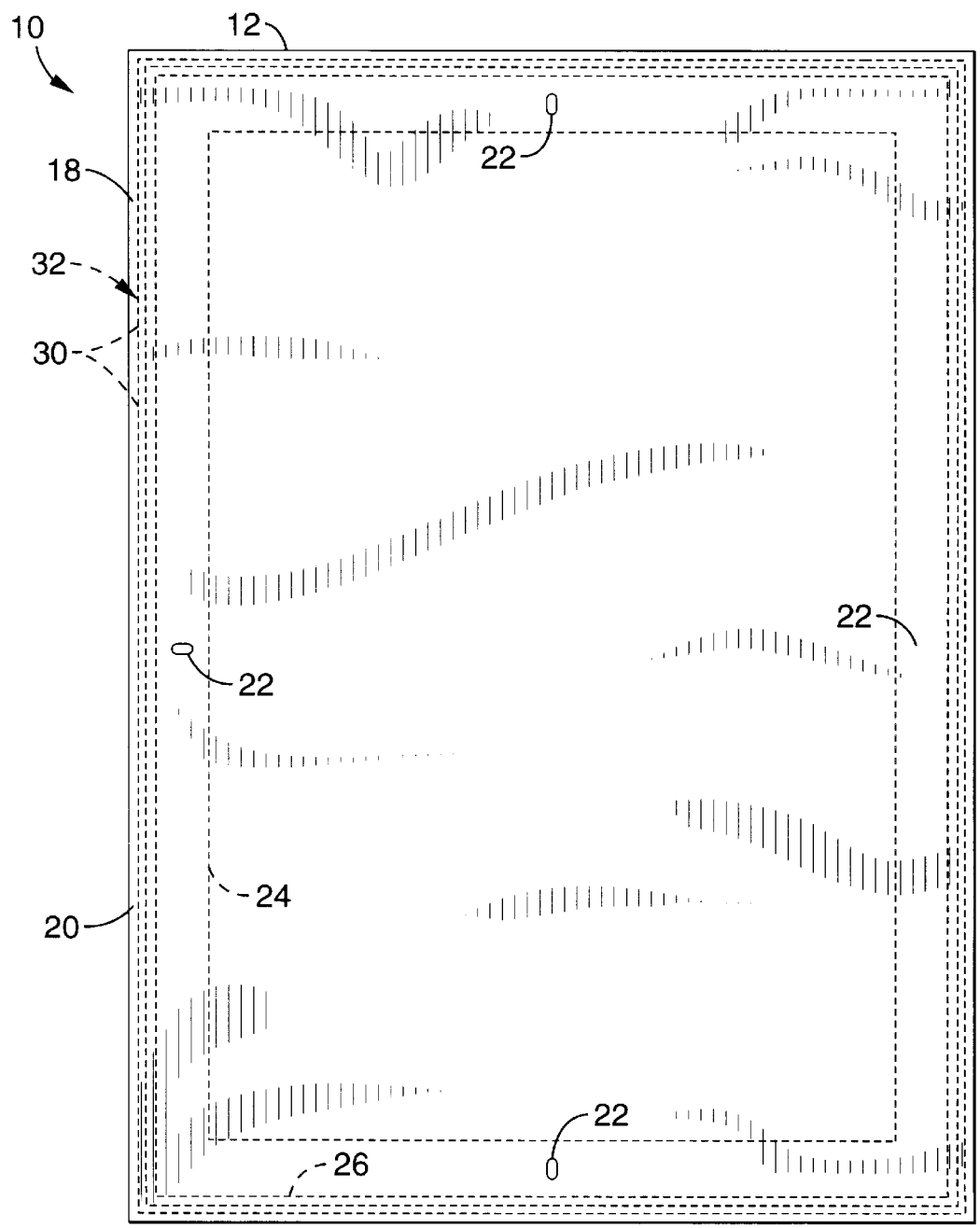
FIG. 4 is a schematic plan view of an adhesive bonded embodiment of a laminate sheet in accordance with the present invention where the adhesive is applied as a band.

Referring now to FIG. 3, for illustrative purposes an alternative embodiment of the invention using an adhesive as a bonding agent is shown. Here, the laminate structure is the same as described previously, except that discontinuous occurrences 28 of adhesive 30 are used instead of welds 16. The adhesive material 30 preferably comprises a rubber compound, as rubber compound adhesives offer more durability in handling prior to its use. Adhesive material 30 is placed around the perimeter of the sheets and within margin 18 that is typically between approximately 0.50 inches and 1 inch wide, depending on end product and customer requirements. Adhesive material 30 is arranged generally linearly in a plurality of occurrences 28 such that gaps or openings 20 are defined between occurrences 28 of adhesive material 30. The width of adhesive material 30 in each occurrence 28 typically varies between approximately 0.002 inches and approximately 0.100 inches, but is typically between approximately 0.060 inches and approximately 0.090 inches, and the height or thickness is typically between approximately 0.001 inches and approximately 0.003 inches. Each occurrence 28 of adhesive material 30 can take the form of lines, strips or dots. While there is no need to do so using steel layer 12 of the present invention because the bellows effect has been eliminated, adhesive material 30 could alternatively be applied as a continuous band 32 as shown in FIG. 4, as is done with copper/aluminum laminate structures. However, the preferred placement of adhesive 30 would be in a gapped configuration as shown where the occurrences 28 of adhesive material 16 make up between approximately 40% to 60% of the perimeter length, thus leaving gaps 20 formed along 40% to 60% of the perimeter.

Accordingly, it will be seen that this invention provides for joining a steel substrate layer and a copper foil layer using resistance welds for use as a laminate structure that is placed in a press lay-up for lamination to produce PCB panels. In addition, the invention also provides a metal substrate layer that is superior in its characteristics than conventional metal substrate layers. Although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

| Composition | 1008 CS STEEL Iron and carbon | 3004 H-19 ALUMINUM Aluminum with traces of magnesium and manganese. |
|---|---|---|
| Hardness (Knoop) | 199–220 | 60–70 |
| Density (lb/in$^3$) | 0.290 | 0.098 |
| CTE (inches/° F.) | 7.2 | 13.9 |
| Yield Strength (lb/in$^2$) | 133,000 | 41,000 |
| Tensile Strength (lb/in$^2$) | 140,000 | 43,000 |

TABLE 1-continued

| Composition | 1008 CS STEEL Iron and carbon | 3004 H-19 ALUMINUM Aluminum with traces of magnesium and manganese. |
|---|---|---|
| Modulus of Elasticity (lb/in$^2$) | 29,000,000 | 10,200,000 |
| Roughness (RMS) | <12 | 18–25 |

What is claimed is:

1. A sheet laminate for use in manufacturing printed circuit boards, comprising:
   (a) a carbon steel substrate layer, said substrate layer having a coefficient of thermal expansion less than approximately 9.8 μinches per °F. and a Knoop hardness between approximately 150 and approximately 850; and
   (b) at least one copper foil layer bonded to a surface of said substrate layer.

2. A sheet laminate as recited in claim 1, wherein said substrate layer has a thickness between approximately 0.002 and approximately 0.025 inches.

3. A sheet laminate as recited in claim 1, wherein said substrate layer has a surface finish of less than approximately 12 RMS.

4. A sheet laminate as recited in claim 1, wherein said copper foil layer has a thickness between approximately 0.00025 and approximately 0.005 inches.

5. A sheet laminate for use in manufacturing printed circuit boards, comprising:
   (a) a carbon steel substrate layer, said substrate layer having a coefficient of thermal expansion less than approximately 9.8 μinches per °F. and a surface finish of less than approximately 12 RMS; and
   (b) at least one foil layer of copper bonded to a surface of said substrate layer.

6. A sheet laminate as recited in claim 5, wherein said substrate layer has a thickness between approximately 0.002 and approximately 0.025 inches.

7. A sheet laminate as recited in claim 5, wherein said copper foil layer has a thickness between approximately 0.00025 and approximately 0.005 inches.

8. A sheet laminate as recited in claim 5, wherein said substrate layer has a Knoop hardness between approximately 150 and approximately 850.

9. A sheet laminate for use in manufacturing printed circuit boards, comprising:
   (a) a carbon steel substrate layer which has a coefficient of thermal expansion less than approximately 9.8 μinches per °F., a Knoop hardness between approximately 150 and approximately 850, and a surface finish of less than approximately 12 RMS; and
   (b) at least one copper foil layer bonded to a surface of said substrate layer, wherein said copper foil layer has a thickness between approximately 0.00025 inches and approximately 0.005 inches.

10. A sheet laminate for use in manufacturing printed circuit boards, comprising:
    (a) a carbon steel substrate layer which has a coefficient of thermal expansion less than approximately 9.8 μinches per °F., a Knoop hardness between approximately 150 and approximately 850, a surface finish of less than approximately 12 RMS, and a thickness between approximately 0.002 and approximately 0.025 inches; and
    (b) at least one copper foil layer having a thickness between approximately 0.00025 and approximately 0.005 inches bonded to a surface of said substrate layer.

* * * * *